United States Patent
Cho et al.

(10) Patent No.: US 9,613,876 B2
(45) Date of Patent: Apr. 4, 2017

(54) THIN FILM TRANSISTOR SUBSTRATE INCLUDING A CHANNEL LENGTH MEASURING PATTERN AND DISPLAY PANEL HAVING THE SAME

(71) Applicant: Samsung Display Co., Ltd., Yongin-si (KR)

(72) Inventors: Yong Tae Cho, Yongin-si (KR); Joong Tae Kim, Yongin-si (KR); In Woo Kim, Yongin-si (KR); Kwang Su Park, Yongin-si (KR); Da Young Lee, Yongin-si (KR); Min Ha Hwang, Yongin-si (KR); Seong Jun Hwang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/976,492

(22) Filed: Dec. 21, 2015

(65) Prior Publication Data

US 2016/0293504 A1    Oct. 6, 2016

(30) Foreign Application Priority Data

Apr. 3, 2015 (KR) .......................... 10-2015-0047684

(51) Int. Cl.
*H01L 21/66* (2006.01)
*H01L 27/12* (2006.01)

(52) U.S. Cl.
CPC .......... *H01L 22/32* (2013.01); *H01L 27/1222* (2013.01); *H01L 27/1248* (2013.01)

(58) Field of Classification Search
CPC ......... H01L 22/00–22/34; H01L 27/12–27/13; H01L 29/786–29/78696; H01L 29/66742–29/6678; H01L 29/4908; H01L 23/544

See application file for complete search history.

(56) References Cited

U.S. PATENT DOCUMENTS

2005/0224876 A1* 10/2005 Kuo ...................... H01L 21/268 257/347
2008/0224332 A1* 9/2008 Tam ........................ H01L 22/34 257/786
2011/0303913 A1* 12/2011 Yamazaki ......... H01L 29/66742 257/43

FOREIGN PATENT DOCUMENTS

| KR | 10-0110381 | 10/1996 |
| KR | 10-2008-0062881 | 7/2008 |
| KR | 10-2008-0083959 | 9/2008 |

* cited by examiner

*Primary Examiner* — Kevin Parendo
(74) *Attorney, Agent, or Firm* — H.C. Park & Associates, PLC

(57) ABSTRACT

A thin film transistor (TFT) substrate includes a base substrate, a TFT disposed on the base substrate. The TFT includes a gate electrode, a semiconductor layer comprising a channel region, and a source electrode and a drain electrode spaced apart from one another by a length of the channel region. The TFT substrate further includes a gate insulating layer disposed between the gate electrode and the semiconductor layer and a measuring pattern configured to measure a length of the channel region.

18 Claims, 4 Drawing Sheets

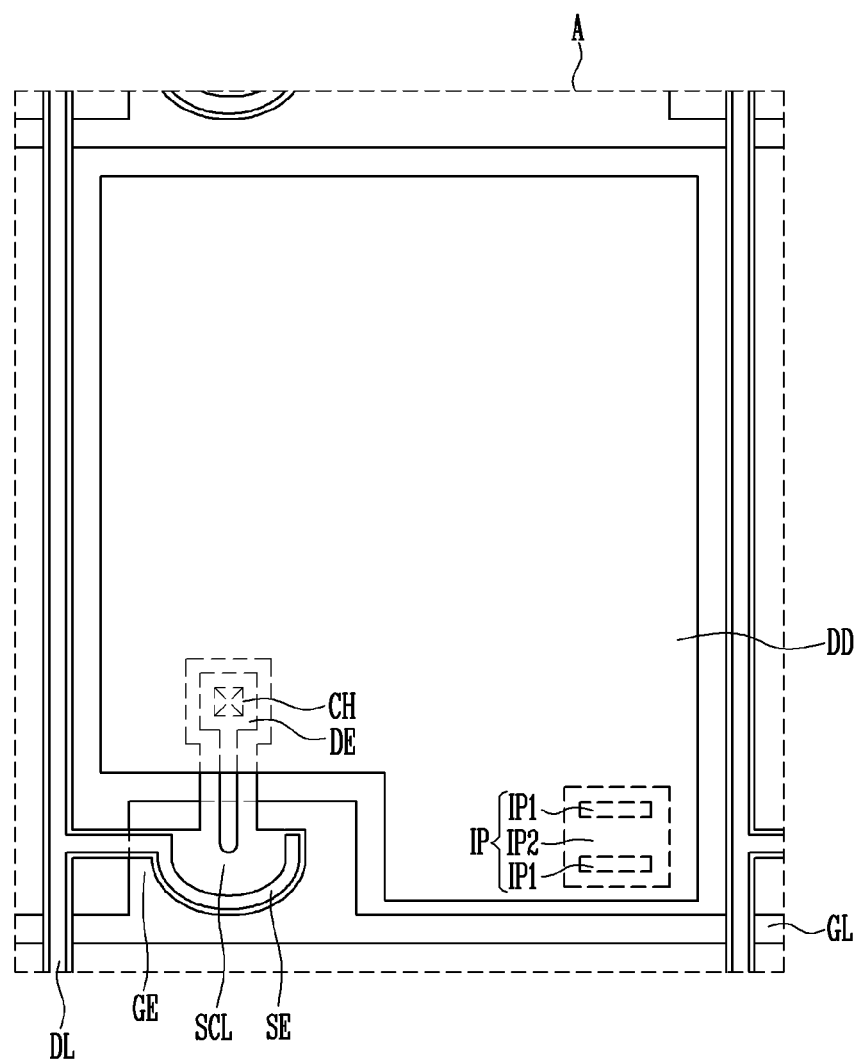

US 9,613,876 B2

THIN FILM TRANSISTOR SUBSTRATE INCLUDING A CHANNEL LENGTH MEASURING PATTERN AND DISPLAY PANEL HAVING THE SAME

CROSS-REFERENCE TO RELATED APPLICATION

This application claims priority from and the benefit of Korean Patent Application No. 10-2015-0047684, filed on Apr. 3, 2015, which is hereby incorporated by reference for all purposes as if fully set forth herein.

BACKGROUND

Field

Exemplary embodiments relate to a thin film transistor (TFT) substrate and a display panel having the same.

Discussion of the Background

A general active matrix type display panel includes a TFT substrate including TFTs and a display device disposed on the TFT substrate.

The TFT substrate includes multiple insulating layers and multiple conductive patterns. Thus, the TFT substrate may be manufactured through multiple patterning processes.

The patterning processes should be performed such that the conductive patterns may not be out of determined positions. In particular, intervals of some conductive patterns need to be maintained. Thus, after performing the patterning processes, the conductive patterns need to be disposed in determined positions without exceeding an error.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a TFT substrate in which positions of conductive patterns or intervals therebetween are accurately measured. In addition, an exemplary embodiment relates to a display panel having the TFT substrate.

Additional aspects will be set forth in the detailed description which follows, and, in part, will be apparent from the disclosure, or may be learned by practice of the inventive concept.

An exemplary embodiment discloses a thin film transistor (TFT) substrate including a base substrate and a TFT disposed on the base substrate. The TFT includes a gate electrode, a semiconductor layer comprising a channel region, and a source electrode and a drain electrode spaced apart from one another by a length of the channel region. The TFT substrate further includes a gate insulating layer disposed between the gate electrode and the semiconductor layer and a measuring pattern configured to measure a length of the channel region.

An exemplary embodiment also discloses a display panel including a thin film transistor (TFT) substrate, a counter substrate facing the TFT substrate, and a display device disposed between the TFT substrate and the counter substrate. The TFT substrate includes a base substrate and a TFT disposed on the base substrate. The TFT includes a gate electrode, a semiconductor layer comprising a channel region, and a source electrode and a drain electrode spaced apart from one another by a length of the channel region. The TFT substrate further includes a gate insulating layer disposed between the gate electrode and the semiconductor layer and a measuring pattern configured to measure a length of the channel region.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 5 is an enlarged view of a portion of a display panel according to another exemplary embodiment.

DETAILED DESCRIPTION OF THE ILLUSTRATED EMBODIMENTS

Figure 1:
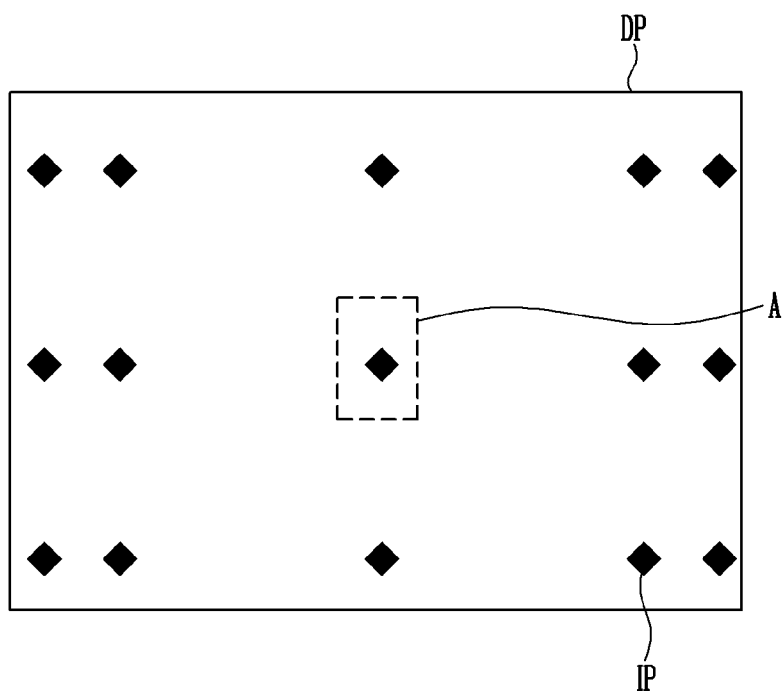
FIG. 1 is a plan view illustrating a display panel according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
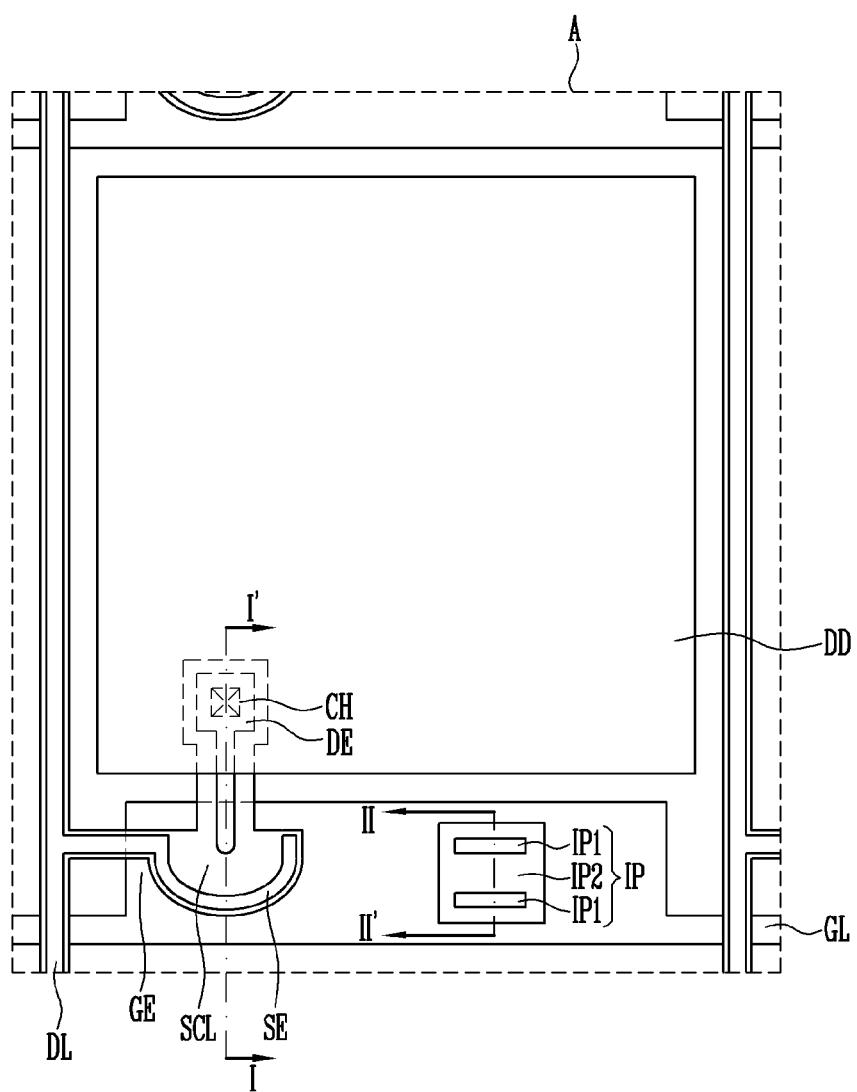
FIG. 2 is an enlarged view of a region "A" of FIG. 1.
Figure 3:
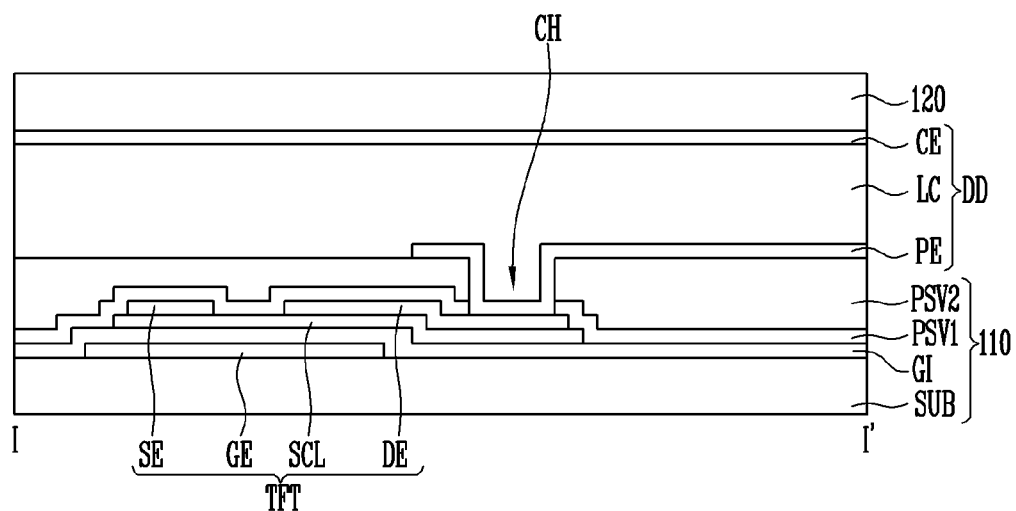
FIG. 3 is a cross-sectional view taken along section line I-I' of FIG. 2.
Figure 4:
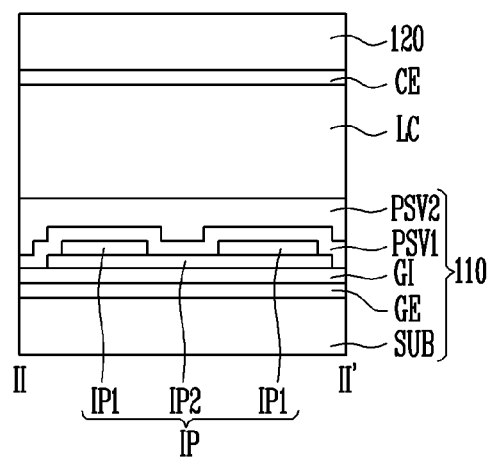
FIG. 4 is a cross-sectional view taken along section line II-II' of FIG. 2.

FIG. 1 is a plan view illustrating a display panel according to an exemplary embodiment. FIG. 2 is an enlarged view of a region "A" of FIG. 1. FIG. 3 is a cross-sectional view taken along section line I-I' of FIG. 2. FIG. 4 is a cross-sectional view taken along section line II-II' of FIG. 2.

Referring to FIGS. 1, 2, 3, and 4, a display panel DP may have a plurality of pixel regions. In addition, the display panel DP may include a thin film transistor (TFT) substrate 110, a counter substrate 120 facing the TFT substrate 110, and display devices DD disposed between the TFT substrate 110 and the counter substrate 120.

The TFT substrate 110 may include a base substrate SUB, at least one TFT disposed on the base substrate SUB in each pixel region, and measuring patterns IP.

The base substrate SUB may include a transparent insulating material allowing for light transmission. In addition, the base substrate SUB may be a rigid-type substrate or a flexible-type substrate. The rigid-type substrate may include a glass substrate, a quartz substrate, a glass ceramic substrate, and a crystalline glass substrate. The flexible-type substrate may include a film substrate and a plastic substrate including a polymer organic substance. A material employed in the base substrate SUB may have resistance to a high treatment temperature (or heat resistance) during a manufacturing process.

The TFT may be connected to a gate line GL and a data line DL. In addition, the TFT may include a gate electrode GE, a semiconductor layer SCL, a source electrode SE, and a drain electrode DE.

The gate electrode GE may be disposed on the base substrate SUB. In addition, the gate electrode GE may have a shape protruding from a portion of the gate line GL. In addition, the gate electrode GE may include at least one of aluminum (Al), an Al alloy, silver (Ag), tungsten (W), copper (Cu), nickel (Ni), chromium (Cr), molybdenum (Mo), titanium (Ti), platinum (Pt), tantalum (Ta), neodymium (Nd), scandium (Sc), and an alloy thereof. An insulating layer (not shown) may be disposed between the gate line GL and the gate electrode GE and the base substrate SUB.

The gate insulating layer GI may be disposed on the gate lines GL and the gate electrode GE to insulate the gate electrode GE and the semiconductor layer SCL. More specifically, the gate insulating layer GI may be disposed between the gate line GL and the gate electrode GE and the semiconductor layer SCL. The gate insulating layer GI may include at least one of a silicon oxide film and a silicon nitride film. For example, the gate insulating layer GI may have a structure in which the silicon oxide film and the silicon nitride film are stacked.

The semiconductor layer SCL may be disposed on the gate insulating layer GI. The semiconductor layer SCL may include at least one of amorphous silicon (a-Si), polycrystalline silicon (p-Si), and an oxide semiconductor. In addition, in the semiconductor layer SCL, regions connected to the source electrode SE and the drain electrode DE may be a source region and a drain region in which impurities are doped or implanted. A region between the source region and the drain region may be a channel region. Here, the oxide semiconductor may include at least one of zinc (Zn), indium (In), gallium (Ga), tin (Sn), and a mixture thereof. For example, the oxide semiconductor may include an indium-gallium-zinc oxide (IGZO).

The source electrode SE may be disposed on the semiconductor layer SCL. In addition, the source electrode SE may have a shape protruding from a portion of the data line DL. The drain electrode DE may be disposed to be spaced apart from the source electrode SE on the semiconductor layer SCL. Here, a distance between the source electrode SE and the drain electrode DE may be a length of the channel region.

The TFT having a bottom gate structure in which the gate electrode GE of the TFT is positioned below the semiconductor layer SCL has been described as an example, but the exemplary embodiment are not so limited. For example, the TFT may be a TFT having a top gate structure in which the gate electrode GE is positioned above the semiconductor layer SCL.

In the display panel DP, some fifteen to twenty measuring patterns IP may be disposed. More specifically, the measuring patterns IP may not necessarily be disposed in all of the pixel regions. For example, the measuring patterns IP may be disposed only in the pixel region representing each point of the display panel DP.

Each measuring pattern IP may be disposed on the gate insulating layer GI and may be electrically insulated from the TFT. In addition, the measuring patterns IP may be disposed within the pixel region. In particular, the measuring patterns IP may overlap the gate electrode GE. Thus, the measuring patterns IP may not degrade transmittance of the pixel region.

The measuring patterns IP may include at least two of first measuring patterns IP1 disposed to be spaced apart from one another on the gate insulating layer GI and a second measuring pattern IP2 disposed between the first measuring patterns IP1 and the gate insulating layer GI.

The first measuring patterns IP1 may include the same material as that of the source electrode SE and the drain electrode DE. In addition, the first measuring patterns IP1 may have a stripe shape extending in one direction and may be parallel to each other. The reason for disposing the first measuring patterns IP1 to be parallel to each other is to easily measure a distance between the first measuring patterns IP1. In general, the length of the channel region is measured as a distance between the source electrode SE and the drain electrode DE. As the size of the TFT is reduced, ends of the source electrode SE and the drain electrode DE may have a curved shape. Thus, the distance between the source electrode SE and the drain electrode DE (i.e., the channel region length) may be measured to be different from the distance between the mutually adjacent first measurement patterns IP1.

A ratio between a difference between the distance between the mutually adjacent first measurement patterns IP1 and the predetermined length of the channel region to the length of the channel region may be within 2%. For example, a difference between the distance between the mutually adjacent first measuring patterns IP1 and the predetermined length of the channel region may be within 0.1 μm. In particular, the distance between the mutually adjacent first measuring patterns IP1 and the predetermined length of the channel region may be substantially equal.

A difference between the distance between the mutually adjacent first measuring patterns IP1 and the predetermined length of the channel region is 0.1 μm is an error limit value in terms of a manufacturing process of the length of the channel region. Thus, when the difference exceeds the error limit value in terms of manufacturing process, it may be regarded that the source electrode SE and the drain electrode DE are misaligned during the manufacturing process. In other words, it may be regarded that the length of the channel region exceeds the error limit value in terms of manufacturing process. When the length of the channel region exceeds the error limit value in terms of manufacturing process, characteristics of the TFT may be changed.

The second measuring pattern IP2 may include the same material as that of the semiconductor layer SCL. More specifically, the second measuring pattern IP2 may include one of amorphous silicon (a-Si), polycrystalline silicon (p-Si), and an oxide semiconductor.

A first passivation layer PSV1 may be disposed on the base substrate SUB on which the TFT and the measuring patterns IP have been disposed. The first passivation layer PSV1 may cover the TFT. The first passivation layer PSV1 may include at least one of a silicon nitride ($SiN_x$) and a silicon oxide ($SiO_x$). For example, the first passivation layer PSV1 may include a silicon nitride film and a silicon oxide film disposed on the silicon nitride film.

A second passivation layer PSV2 may be disposed on the first passivation layer PSV1. The second passivation layer PSV2 may include a transparent organic insulating material. For example, the second passivation layer PSV2 may include at least one of an acrylic resin, an epoxy resin, a phenolic resin, a polyamide resin, a polyimide resin, an unsaturated polyester resin, a poly-phenylene ether resin, a poly-phenylene sulfide resin, and a benzocyclobutene resin.

A display device DD connected to the drain electrode DE through a contact hole CH may be disposed on the second passivation layer PSV2. Here, the contact hole CH may expose the drain electrode DE by penetrating through the first passivation layer PSV1 and the second passivation layer PSV2.

The display device DD may be any one of a liquid crystal display (LCD) device, an electrophoretic display (EPD) device, an electrowetting display (EWD) device, and an organic light emitting display (OLED) device. Meanwhile, in this embodiment, for the purposes of description, an LCD device will be described as an example of the display device DD. In addition, although not shown, the display device DD may display an image using light provided from a backlight unit.

The display device DD may include a first electrode PE, a second electrode CE facing the first electrode PE, and an optical layer LC disposed between the first electrode PE and the second electrode CE and allowing light to be transmitted therethrough or generating light.

The first electrode PE may be disposed on the second passivation layer PSV2 and may be connected to the drain electrode DE through the contact hole CH. In addition, the first electrode PE may include a transparent conductive oxide such as ITO or IZO.

The optical layer LC may include liquid crystal molecules. The liquid crystal molecules may be aligned in a particular direction by an electric field formed between the first electrode PE and the second electrode CE to adjust transmittance of light. Thus, the optical layer LC may allow light provided from the backlight unit by the electric field to be transmitted therethrough such that the display device DD displays an image.

Like the first electrode PE, the second electrode CE may include a transparent conductive oxide such as ITO or IZO. In addition, the second electrode CE may receive a common voltage Vcom provided from an external source. The second electrode CE may be disposed on one surface of the counter substrate 120 facing the base substrate SUB.

The counter substrate 120 may include a color filter (not shown) implementing a predetermined color using light provided from the backlight unit as well as the second electrode CE. Here, the color filter may have any one of the colors red, green, blue, cyan, magenta, yellow, and white.

Meanwhile, in the present exemplary embodiment, the first electrode PE is disposed on the TFT substrate 110, the second electrode CE is disposed on the counter substrate 120, and the optical layer LC is disposed between the first electrode PE and the second electrode CE. However exemplary embodiments are not so limited. Instead, the first electrode PE and the second electrode CE may be disposed on the TFT substrate 110. The optical layer LC may be disposed between the first electrode PE and the second electrode CE and the counter substrate 120. Here, the first electrode PE may include branch portions to form an in-plane field with the second electrode CE.

Hereinafter, other exemplary embodiments will be described with reference to FIG. 5. In FIG. 5, the same reference numerals will be used for the same components as those illustrated in FIGS. 1 through 4 and a detailed description thereof will be omitted. In addition, in FIG. 5, differences from those of FIGS. 1-4 will be largely described for brevity.

FIG. 5 is an enlarged view of a portion of a display panel according to another exemplary embodiment.

Referring to FIG. 5, a display panel DP may include a TFT substrate 110, a counter substrate 120 facing the TFT substrate, and display devices DD disposed between the TFT substrate 110 and the counter substrate 120.

The display devices DD may include a first electrode PE (not shown), a second electrode CE (not shown) facing the first electrode PE, and an optical layer LC (not shown) disposed between the first electrode PE and the second electrode CE and allowing light to be transmitted therethrough or generating light.

The TFT substrate 110 may include a base substrate SUB, at least one TFT disposed on the base substrate SUB in each pixel region, and measuring patterns IP.

The TFT may include a gate electrode GE, a semiconductor layer SCL, a source electrode SE, and a drain electrode DE. In addition, a gate insulating layer GI may be disposed between the gate electrode GE and the semiconductor layer SCL.

Each of the measuring patterns IP may be disposed on the gate insulating layer GI and may be electrically insulated from the TFT. In addition, the measuring patterns IP may be disposed within the pixel region. In particular, at least a portion of the measuring patterns IP may overlap the display device DD. For example, the measuring patterns IP may overlap the first electrode PE of the display device DD.

Meanwhile, in the display panel DP, some fifteen to twenty measuring patterns IP may be disposed. More specifically, the measuring patterns IP are disposed only in some pixel regions rather than all of the pixel regions of the display panel DP. Thus, even though the measuring patterns IP overlap the display device DD, the overlapping may not affect display quality of the display panel DP.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A thin film transistor (TFT) substrate, comprising:
a base substrate;
a TFT disposed on the base substrate, the TFT comprising:
  a gate electrode;
  a gate insulating layer disposed on the gate electrode;
  a semiconductor layer disposed on the gate insulating layer, the semiconductor layer comprising a channel region;
  a source electrode disposed on the semiconductor layer, the source electrode comprising a concave edge; and
  a drain electrode disposed on the semiconductor layer and spaced apart from the source electrode by a first distance equal to a length of the channel region;
and
a measuring pattern disposed on the gate insulating layer and electrically insulated from the TFT, the measuring pattern comprising:
a first portion disposed on the gate insulating layer; and
two second portions spaced apart from each other by a second distance, extending parallel in a first direction, and disposed on the first portion,
wherein the concave edge of the source electrode faces the drain electrode in plan view.

2. The TFT substrate of claim 1, wherein the first distance is within 2% of the second distance.

3. The TFT substrate of claim 1, wherein a difference between the first distance and the second distance is within 0.1 μm.

4. The TFT substrate of claim 1, wherein at least one second portion of the measuring pattern comprises the same material as the source electrode.

5. The TFT substrate of claim 4, wherein at least one second portion of the measuring pattern comprises the same material as the drain electrode.

6. The TFT substrate of claim 1, wherein the first portion of the measuring pattern comprises the same material as the semiconductor layer.

7. The TFT substrate of claim 1, wherein the measuring pattern overlaps the gate electrode.

8. A display panel, comprising:
a thin film transistor (TFT) substrate;
a counter substrate facing the TFT substrate; and
a display device disposed between the TFT substrate and the counter substrate,
wherein the TFT substrate comprises:
  a base substrate;
  a TFT disposed on the base substrate, the TFT comprising:
    a gate electrode;
    a gate insulating layer disposed on the gate electrode;
    a semiconductor layer disposed on the gate insulating layer, the semiconductor layer comprising a channel region;
    a source electrode disposed on the semiconductor layer, the source electrode comprising a concave edge; and
    a drain electrode disposed on the semiconductor layer and spaced apart from the source electrode by a first distance equal to a length of the channel region;
  and
  a measuring pattern disposed on the gate insulating layer and electrically insulated from the TFT, the measuring pattern comprising:
  a first portion disposed on the gate insulating layer; and
  two second portions spaced apart from each other by a second distance, extending parallel in a first direction, and disposed on the first portion,
  wherein the concave edge of the source electrode faces the drain electrode in plan view.

9. The display panel of claim 8, wherein the first distance is within 2% of the second distance.

10. The display panel of claim 8, wherein a difference between the first distance and the second distance is within 0.1 μm.

11. The display panel of claim 8, wherein at least one second portion of measuring pattern comprises the same material as the source electrode.

12. The display panel of claim 11, wherein at least one second portion of the measuring pattern comprises the same material as the drain electrode.

13. The display panel of claim 8, wherein the first portion of the measuring pattern comprises the same material as the semiconductor layer.

14. The display panel of claim 8, wherein the measuring pattern overlaps the gate electrode.

15. The display panel of claim 8, wherein at least a part of the measuring pattern overlaps the display device.

16. A thin film transistor (TFT) substrate, comprising:
a base substrate;
a TFT disposed on the base substrate, the TFT comprising:
    a gate electrode;
    a gate insulating layer disposed on the gate electrode;
    a semiconductor layer disposed on the gate insulating layer, the semiconductor layer comprising a channel region;
    a source electrode disposed on the semiconductor layer; and
    a drain electrode disposed on the semiconductor layer and spaced apart from the source electrode by a first distance equal to a length of the channel region; and
a measuring pattern disposed on gate insulating layer and electrically insulated from the TFT, the measuring pattern comprising:
    a first portion disposed on the gate insulating layer; and
    two second portions spaced apart from each other by a second distance, extending parallel in a first direction, and disposed on the first portion.

17. The TFT substrate of claim 16, wherein the first distance is within 2% of the second distance.

18. The TFT substrate of claim 17, wherein the measuring pattern is spaced apart from the gate electrode in plan view.

* * * * *